(12) United States Patent
Onishi et al.

(10) Patent No.: US 12,203,995 B2
(45) Date of Patent: Jan. 21, 2025

(54) BATTERY CONTROL DEVICE

(71) Applicant: TOYOTA JIDOSHA KABUSHIKI KAISHA, Toyota (JP)

(72) Inventors: Kenta Onishi, Kariya (JP); Kenta Fujimoto, Toyota (JP); Yoshihiro Uchida, Nagakute (JP); Yuki Sugo, Toyota (JP); Ryota Takizawa, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 378 days.

(21) Appl. No.: 17/661,344

(22) Filed: Apr. 29, 2022

(65) Prior Publication Data

US 2022/0381836 A1 Dec. 1, 2022

(30) Foreign Application Priority Data

May 26, 2021 (JP) ................................ 2021-088513

(51) Int. Cl.
    *G01R 31/382* (2019.01)
    *B60W 20/10* (2016.01)
    *H01M 10/44* (2006.01)
    *H02J 7/00* (2006.01)

(52) U.S. Cl.
    CPC .......... *G01R 31/382* (2019.01); *B60W 20/10* (2013.01); *H01M 10/443* (2013.01); *H02J 7/0049* (2020.01)

(58) Field of Classification Search
    CPC ......................... G01R 31/382; H02J 7/0049
    See application file for complete search history.

(56) References Cited

FOREIGN PATENT DOCUMENTS

| CN | 103180747 A | | 6/2013 |
|---|---|---|---|
| JP | 2012-029455 A | | 2/2012 |
| JP | 2013-101072 A | | 5/2013 |
| JP | 2016-023970 A | | 2/2016 |
| JP | 2017-195681 A | | 10/2017 |
| JP | 2020094871 A | * | 6/2020 |
| WO | WO 2012/010955 A2 | | 1/2012 |

* cited by examiner

*Primary Examiner* — Lam S Nguyen
(74) *Attorney, Agent, or Firm* — Finnegan, Henderson, Farabow, Garrett and Dunner, LLP

(57) ABSTRACT

A battery control device includes a processor that is configured to estimate a full charge capacity of a battery based on an amount of current supplied to the battery from a start of charging to an end of charging and voltages of the battery at the start of charging and the end of charging when the battery is charged from a state where a voltage of the battery is below a predetermined start voltage threshold value to a state where the voltage exceeds a predetermined end voltage threshold value, and the battery satisfies a predetermined permission condition.

4 Claims, 5 Drawing Sheets

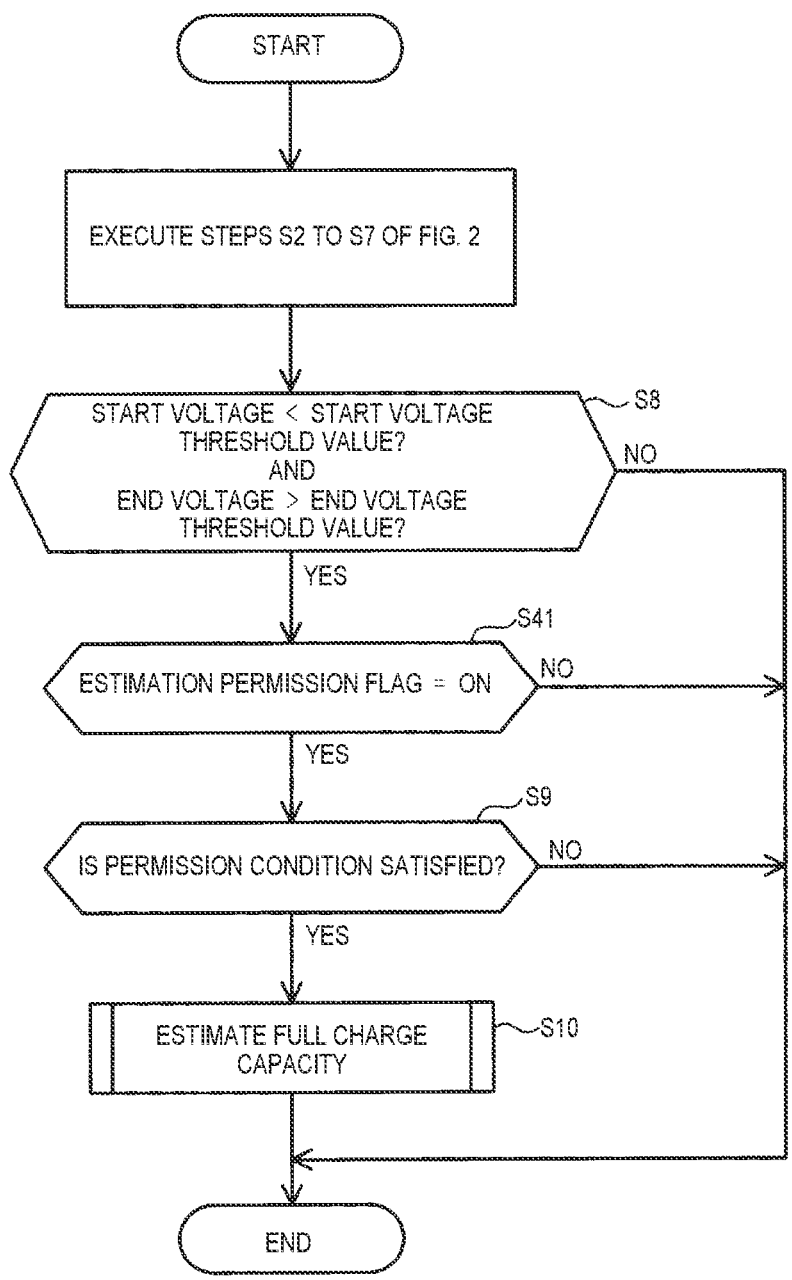

BATTERY CONTROL DEVICE

CROSS-REFERENCE TO RELATED APPLICATION

This application claims priority to Japanese Patent Application No. 2021-088513 filed on May 26, 2021, incorporated herein by reference in its entirety.

BACKGROUND

1. Technical Field

A technology disclosed in the present specification relates to a control device for a rechargeable battery.

2. Description of Related Art

A full charge capacity of a battery changes due to deterioration over time. The full charge capacity means an electric capacity of the battery corresponding to a charge rate of 100%. When the full charge capacity changes, the charge rate (a ratio of a remaining capacity to the full charge capacity) of the battery and an actual remaining capacity of the battery do not match. Therefore, it is desirable that a battery control device periodically re-estimates the full charge capacity.

Estimation accuracy of the full charge capacity may decrease depending on a state of the battery. In the estimation method disclosed in Japanese Unexamined Patent Application Publication No. 2017-195681, a battery is discharged at a rate equal to or lower than a predetermined discharge rate prior to estimation of a full charge capacity. The full charge capacity is estimated based on a battery voltage and an amount of current by which the battery is charged. By discharging slowly, it is possible to restrict a voltage fluctuation (a fluctuation of an open circuit voltage) of the battery after discharging, and thus it is possible to accurately estimate the full charge capacity.

SUMMARY

The present specification provides a technique for estimating a full charge capacity of a battery with high accuracy by using an approach different from that of the above technique.

A battery control device according to an aspect of the present disclosure is configured to estimate a full charge capacity of a battery. The battery control device includes a processor configured to, when the battery is charged from a state where a voltage of the battery is below a predetermined start voltage threshold value to a state where the voltage exceeds a predetermined end voltage threshold value, and the battery satisfies a predetermined permission condition, estimate the full charge capacity of the battery based on an amount of current supplied to the battery from a start of charging to an end of charging and voltages of the battery at the start of charging and the end of charging.

The control device disclosed in the present specification stores a condition (a permission condition) in which estimating the full charge capacity with high accuracy is possible and estimates the full charge capacity when the permission condition is satisfied. Therefore, the full charge capacity can be estimated with high accuracy.

In the above aspect, the predetermined permission condition includes at least one of following conditions (i) to (v). (i) Temperatures of the battery at the start of charging and the end of charging exceed a predetermined allowable temperature threshold value. (ii) Before the start of charging, current flowing in and out of the battery is below a predetermined first current threshold value for at least a predetermined standby time. (iii) An average current supplied to the battery during charging exceeds a predetermined second current threshold value. (iv) A charging time from the start of charging to the end of charging is shorter than a predetermined charging time threshold value. (v) The charging time is shorter than a capacity estimation prohibition time corresponding to an average current obtained by dividing the amount of current by the charging time.

When the permission condition of (i) or (ii) is satisfied, a voltage fluctuation (a fluctuation of an open circuit voltage of the battery) of the battery caused by battery polarization becomes small. The full charge capacity is estimated based on the battery voltages at the start of charging and the end of charging and the amount of current supplied to the battery. When the voltage fluctuation (the fluctuation of the open circuit voltage) of the battery is small, the full charge capacity can be estimated with high accuracy. The amount of current supplied to the battery is obtained by integrating measured values of a current sensor that measures current which charges the battery. An offset error can be included in measured values of the current sensor. The permission conditions (iii) to (v) reduce an integrated value of the offset errors included in the measured values of the current sensor. That is, when the permission conditions are satisfied, measurement accuracy of the amount of current supplied to the battery during charging is improved. Therefore, the full charge capacity can be estimated with high accuracy. In particular, the condition (v) is effective when the average current during charging also includes an influence of the offset error. The capacity estimation prohibition time corresponding to the average current is typically stored in advance in the battery control device.

In the above aspect, the processor may be configured to store a charge counter that is the number of times that charging by which the voltage at the end of charging does not reach the predetermined end voltage threshold value is executed after the battery is discharged under a predetermined discharge condition, and prohibit estimation of the full charge capacity regardless of whether the predetermined permission condition is satisfied in a case where the charge counter exceeds a predetermined number-of-times threshold value when the voltage exceeds the predetermined end voltage threshold value at the end of charging.

Repeated charging by which the voltage at the end of charging does not reach the end voltage threshold value also causes a large fluctuation in the open circuit voltage of the battery. By prohibiting the estimation of the full charge capacity when the charging by which the voltage at the end of charging does not reach the end voltage threshold value is executed more than the predetermined number of times even when the permission condition is satisfied, it is possible to avoid estimating with low accuracy.

In the above aspect, the processor may be configured to estimate the full charge capacity based on open circuit voltages of the battery at the start of charging and the end of charging.

In the above aspect, the battery control device may be mounted on an automobile in which the battery is connected to an inverter that drives a traveling motor. The predetermined permission condition may include a condition that the inverter is cut off from the battery for at least a predetermined standby time before the start of charging.

Details of and further improvements to the technique disclosed in the present specification will be described in the "DETAILED DESCRIPTION OF EMBODIMENTS" section below.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein:

FIG. 6 is a flowchart of a determination process of whether to perform the full charge capacity estimation (a second embodiment).

DETAILED DESCRIPTION OF EMBODIMENTS

First Embodiment

Figure 1:
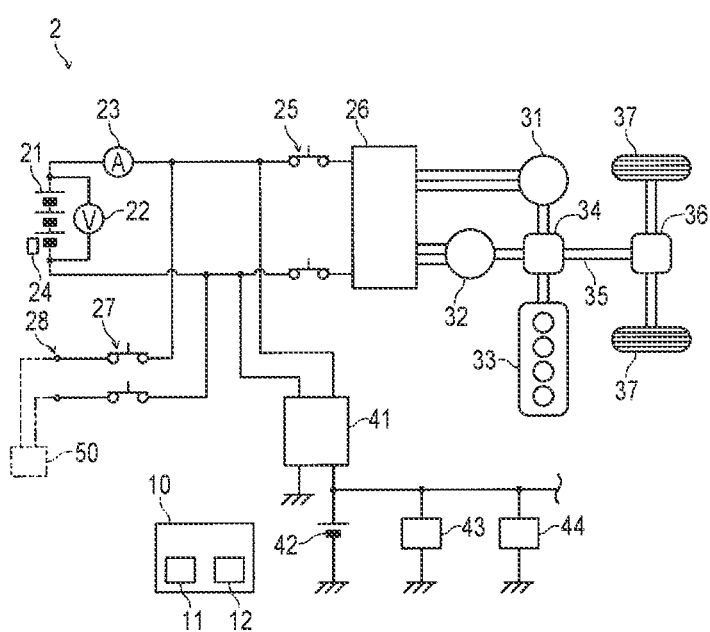
FIG. 1 is a block diagram of an electric power system of a hybrid vehicle including a control device of an embodiment.

A battery control device (a control device 10) of an embodiment will be described with reference to the drawings. The control device 10 is mounted on a hybrid vehicle 2. FIG. 1 illustrates a block diagram of an electric power system of the hybrid vehicle 2 including the control device 10. The hybrid vehicle 2 includes two motors 31, 32, and an engine 33 for traveling. The hybrid vehicle 2 includes a main battery 21 and an inverter 26, and the inverter 26 converts output electric power (direct current electric power) of the main battery 21 into drive electric power (three-phase alternating current electric power) of the respective motors 31, 32.

Output shafts of the motors 31, 32 and an output shaft of the engine 33 are engaged with each other via gears by a power distribution mechanism 34. The power distribution mechanism 34 synthesizes output torque of the engine 33 and output torque of the motors 31, 32 and transmits the synthesized torque to an axle 35. The synthesized output torque is transmitted to drive wheels 37 via a differential gear 36.

The power distribution mechanism 34 may distribute the output torque of the engine 33 to the axle 35 and the motor 31. The motor 31, which is reversely driven by a part of the output torque of the engine 33, functions as a generator. The electric power (alternating current electric power) generated by the motor 31 is converted into direct current electric power by the inverter 26 and charges the main battery 21.

The motors 31, 32 may generate electricity using inertial energy of the vehicle. The electric power obtained from the inertial energy of the vehicle is called regenerative electric power. The regenerative electric power is also converted into direct current electric power by the inverter 26 and charges the main battery 21.

As described above, the main battery 21 may be charged with the electric power generated by the motors 31, 32.

Further, the main battery 21 may be charged by an external electric power source 50, such as a household outlet. An electric power inlet 28 is connected to the main battery 21 via a high voltage relay 27. An external electric power source 50 may be connected to the electric power inlet 28. In FIG. 1, the external electric power source 50 is drawn by a virtual line. The external electric power source 50 can be connected to the main battery 21 via the electric power inlet 28 only when the hybrid vehicle 2 is stopped.

A step-down converter 41 is also connected to the main battery 21. The step-down converter 41 lowers voltage of the output electric power of the main battery 21 to voltage of an auxiliary device battery 42. The electric power stepped down by the step-down converter 41 is supplied to the auxiliary device battery 42 and is also supplied to a plurality of auxiliary devices 43, 44. The auxiliary devices 43, 44 are a general term for devices driven by the electric power of the auxiliary device battery 42. Audio and navigation devices are examples of the auxiliary devices 43, 44.

The main battery 21 is connected to the inverter 26 via a system main relay 25. When the system main relay 25 is open, the main battery 21 is electrically cut off from the inverter 26 and the motors 31, 32. When the high voltage relay 27 is closed and the main battery 21 is charged by the external electric power source 50, the system main relay 25 is opened and the main battery 21 is cut off from the inverter 26 (the motors 31, 32).

The hybrid vehicle 2 also includes a voltage sensor 22 that measures the voltage of the main battery 21, a current sensor 23 that measures the current that flows in and out of the main battery 21, and a temperature sensor 24 that measures the temperature of the main battery 21. Measured values of the sensors 22, 23, 24 are sent to the control device 10.

The control device 10 controls a traveling drive system (that is, the inverter 26 and the engine 33) of the hybrid vehicle 2, and also controls the main battery 21 based on the measured values of the sensors 22, 23, 24. The control device 10 may estimate a full charge capacity of the main battery 21 when the main battery 21 is charged by the external electric power source 50. The control device 10 includes a computer 11 including a processor and a storage device 12. When the computer 11 executes a capacity estimation program stored in the storage device 12, the control device 10 functions as a battery control device that estimates the full charge capacity of the main battery 21.

As described above, the main battery 21 may be charged with the regenerative electric power of the motors 31, 32, or may be charged by the external electric power source 50. The estimation of the full charge capacity is performed only when the charging is executed with the external electric power source 50 and a predetermined permission condition is satisfied. When the permission condition is not satisfied, the full charge capacity may not be estimated accurately, and thus the full charge capacity is not estimated. Conversely, the full charge capacity can be accurately estimated by estimating the full charge capacity only when the permission condition is satisfied.

Figure 2:
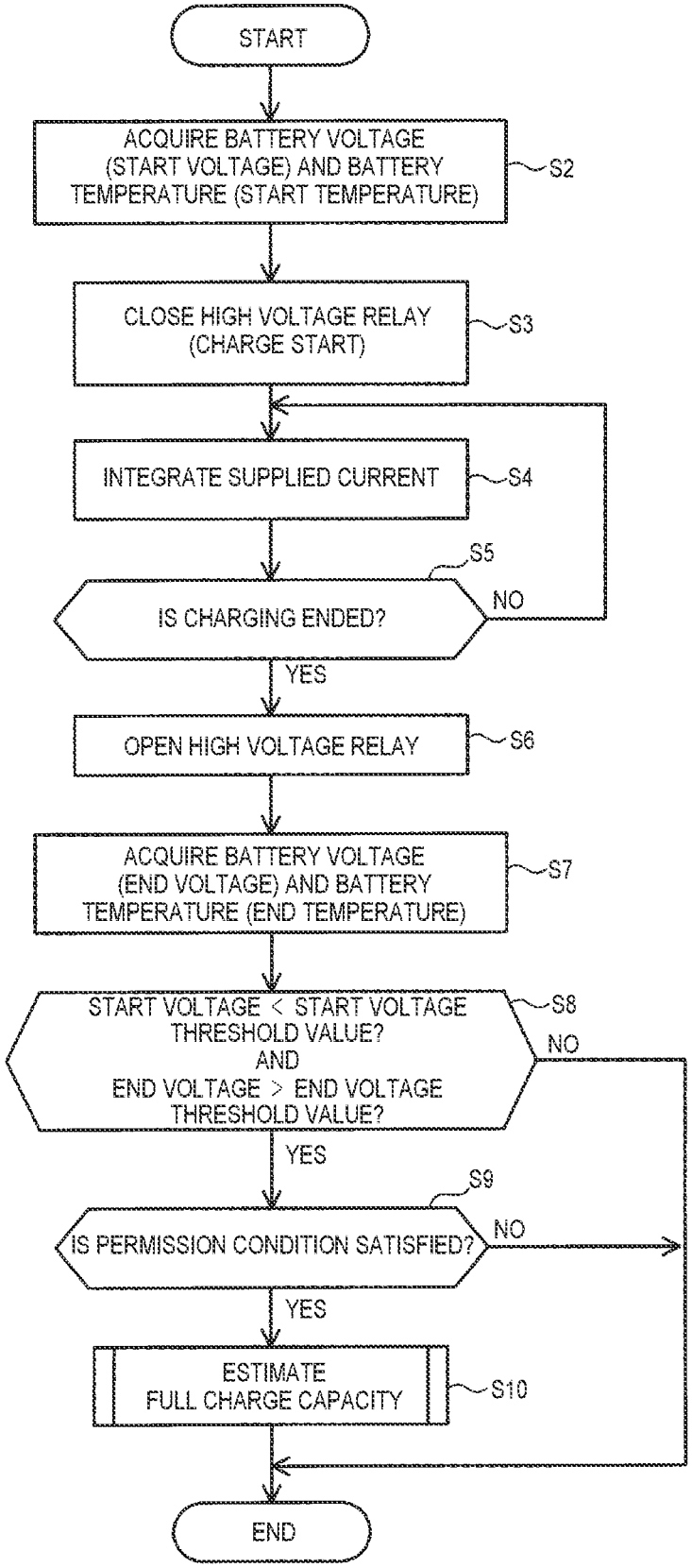
FIG. 2 is a flowchart of a determination process of whether to perform full charge capacity estimation (a first embodiment)

FIG. 2 illustrates a flowchart of a process for determining whether to perform the full charge capacity estimation by the control device 10. The process of FIG. 2 is started when the external electric power source 50 is connected to the electric power inlet 28. In addition to the process illustrated in FIG. 2, the control device 10 measures an elapsed time since the system main relay 25 is opened. For convenience of description, the elapsed time since the system main relay 25 is opened is referred to as a main relay opening time. The main relay opening time may be used in the permission condition. The permission condition will be described in detail below.

The control device 10 acquires the battery voltage and the battery temperature (step S2). The battery voltage is measured by the voltage sensor 22, and the battery temperature is measured by the temperature sensor 24. Since step S2 is executed immediately before the start of charging, the battery voltage and the battery temperature acquired in step S2 are referred to as a start voltage and a start temperature for convenience of description.

Charging by the external electric power source 50 is executed while the system main relay 25 is open. While the system main relay 25 is open, the inverter 26 and the motors 31, 32, which can consume a large amount of power, are disconnected from the main battery 21. When the system main relay 25 is open, and before the start of charging, only a small amount of current can flow in and out of the main battery 21. The voltage of the main battery 21 in a state where almost no current inflow and outflow exist is called an open circuit voltage. The full charge capacity is estimated using the open circuit voltages of the main battery 21 before and after charging. The start voltage acquired in step S2 corresponds to the open circuit voltage when charging of the main battery 21 is started.

Next, the control device 10 closes the high voltage relay 27 and starts charging the main battery 21 (step S3). The control device 10 integrates the current supplied to the main battery 21 from the start to the end of charging (step S5: NO, S4). The integrated value represents the amount of current supplied to the main battery 21 from the start to the end of charging. The current supplied to the main battery 21 is measured by the current sensor 23.

The control device 10 monitors the voltage of the main battery 21, and ends charging when the voltage exceeds an end voltage threshold value (step S5: YES). However, charging may be ended before the voltage of the main battery 21 reaches the end voltage threshold value due to a malfunction on the side of the external electric power source 50 or the like.

When charging is ended, the control device 10 opens the high voltage relay 27 (step S6) and subsequently acquires the battery voltage and the battery temperature (step S7). For convenience of description, the battery voltage and the battery temperature acquired in step S6 are referred to as an end voltage and an end temperature. Since the high voltage relay 27 is open in step S6, no current is flowing through the main battery 21 when the battery voltage is acquired in step S6. That is, the end voltage corresponds to the open circuit voltage of the main battery when charging is ended.

The control device 10 compares the start voltage and a start voltage threshold value, and compares the end voltage and the end voltage threshold value (step S8). When the start voltage is below the start voltage threshold value and the end voltage is above the end voltage threshold value, the control device 10 checks the permission condition (step S8: YES, S9). When the start voltage is above the start voltage threshold value or the end voltage is below the end voltage threshold value, the control device 10 ends the process without estimating the full charge capacity (step S8: NO).

The start voltage threshold value is typically set to a voltage corresponding to a case where a charge rate (SOC: State Of Charge) of the main battery 21 is 10%. The end voltage threshold value is set to a voltage corresponding to a case where the charge rate of the main battery 21 is 90%. As is well known, a correlation exists between the charge rate of the battery and the battery voltage, and the control device 10 can obtain the charge rate at the start of charging from the start voltage and the charge rate at the end of charging from the end voltage.

The condition of step S8 guarantees that the main battery 21 is charged with a corresponding amount of current. By estimating the full charge capacity when the main battery 21 is charged with the corresponding amount of current, the estimation accuracy can be improved.

The control device 10 performs a full charge capacity estimation process when a predetermined permission condition is satisfied (step S9: YES, S10). The permission condition is stored in the control device 10 (the storage device 12) in advance.

The permission conditions are as follows. (1) Each of the temperatures of the main battery 21 at the start and the end of charging exceeds a predetermined allowable temperature threshold value. (2) Before the start of charging, the current flowing in and out of the main battery 21 is below a predetermined first current threshold value for at least a predetermined standby time. (3) The average current supplied to the battery during charging exceeds a predetermined second current threshold value. (4) The charging time is shorter than a predetermined charging time threshold value. (5) The charging time is shorter than a capacity estimation prohibition time corresponding to the average current obtained by dividing the amount of current supplied to the main battery 21 from the start of charging to the end of charging by the charging time.

The permission condition may be that any one of the conditions (1) to (5) is satisfied, or may be that all of the plurality of conditions selected from (1) to (5) are satisfied. Further, instead of the condition (1), it may be a condition that the temperature of the main battery 21 continuously exceeds the allowable temperature threshold value from the start of charging to the end of charging.

It is known that when the condition (1) or (2) is satisfied, the fluctuation of the open circuit voltage caused by battery polarization of the main battery 21 becomes small. In the case of the embodiment, it is guaranteed that the current flowing in and out of the main battery 21 falls below the first current threshold value while the system main relay 25 is open. Therefore, it is guaranteed that the current flowing in and out of the main battery 21 falls below the first current threshold value while the main relay opening time exceeds the standby time. The condition (2) may be rephrased as "the inverter 26 is cut off from the main battery 21 before the start of charging, at least for the standby time".

The first current threshold value may be, for example, 0.001 [c rate]. The [c rate] is a unit representing the charging (discharging) speed of the battery. Further, 1.0 [c rate] corresponds to charging the battery from a 0% charge rate to a 100% charge rate in one hour (or discharging the battery from a 100% charge rate to a 0% charge rate in one hour).

The full charge capacity of the main battery 21 is the current capacity when the main battery 21 is fully charged and means the current capacity corresponding to the charge rate of 100%. The full charge capacity is estimated from the battery voltages (open circuit voltages) at the start and the end of charging and the amount of current supplied to the main battery 21 from the start to the end of charging. When the permission condition (1) or (2) is satisfied, the fluctuation of the open circuit voltage due to the electric polarization can be restricted, such that the full charge capacity can be estimated with high accuracy.

When the condition (3) or (4) is satisfied, it is possible to restrict the accumulation of an offset error of the current sensor when integrating the current. The offset error means a deviation between the actual current flowing through the main battery 21 and the measured value of the current sensor 23. When the offset error is large, an error of the amount (the integrated value of the measured values of the current sensor 23) of current supplied to the main battery 21 becomes large. When an average current supplied to the battery during charging exceeds the predetermined second current threshold value (the permission condition (3)), an influence of the offset error becomes relatively small. Further, even when the charging time is short (the permission condition (4)), the influence of the offset error becomes relatively small. When the permission condition (3) or (4) is satisfied, the influence of the offset error of the current sensor can be restricted, such that the full charge capacity can be estimated with high accuracy.

When the average current supplied to the main battery 21 during charging is large, the charging time will be short, and thus the conditions (3) and (4) are equivalent. The second current threshold value may be, for example, 0.2 [c rate], and the charge time threshold value may be, for example, 5 [hours].

When the condition (5) is satisfied, the influence of the offset error of the current sensor 23 when integrating the current can be more effectively restricted. Once the average current is determined, a rough charging time (an expected charging time) is determined. Charging is ended when the battery voltage reaches an end voltage threshold value. A situation in which the charging time is longer than expected occurs when the measured value of the current sensor 23 contains a large offset error and the current actually supplied to the main battery 21 is lower than the measured value of the current sensor 23. The capacity estimation prohibition time is set to be longer than the expected charging time corresponding to the average current. When the actual charging time still exceeds the capacity estimation prohibition time, it means that the measured value of the current sensor 23 includes a large offset error. When the actual charging time exceeds the capacity estimation prohibition time, by stopping the estimation of the full charge capacity, it is possible to exclude a case where the offset error is large (that is, the accuracy of the estimation of the full charge capacity is lowered). Conversely, when the actual charge time is shorter than the capacity estimation prohibition time, the full charge capacity can be estimated accurately by allowing the estimation of the full charge capacity. The capacity estimation prohibition time corresponding to the average current is typically stored in advance in the control device 10. For example, the storage device 12 of the control device 10 stores a plurality of average currents and the capacity estimation prohibition time corresponding to each average current. Alternatively, the storage device 12 of the control device 10 stores a relational expression between the average current and the capacity estimation prohibition time.

Figure 3:
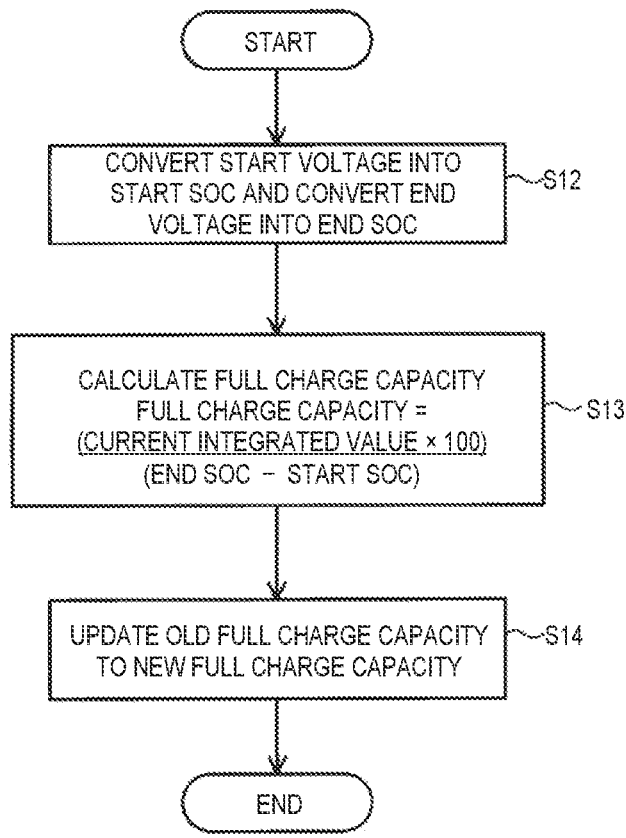
FIG. 3 is a flowchart for the full charge capacity estimation.

The full charge capacity estimation process will be described with reference to FIG. 3. As described above, a correlation exists between the open circuit voltage of the main battery 21 and the charge rate. The control device 10 stores the correlation. The control device 10 refers to the correlation, converts the start voltage into the charge rate (a start SOC) at the start of charging, and converts the end voltage into the charge rate (an end SOC) at the end of charging (step S12). The unit of SOC is [%]. The control device 10 calculates the full charge capacity using the start SOC, the end SOC, and the current (the charged current amount) integrated in step S4 (step S13). The full charge capacity is obtained by the formula [current integrated value]×100/([end SOC]− [start SOC]).

Finally, the control device 10 updates the stored old full charge capacity to a new full charge capacity calculated in step S13 (step S14).

Second Embodiment

Subsequently, a battery control device of a second embodiment will be described. The battery control device (the control device 10) of the second embodiment determines whether to estimate the full charge capacity depending on the state of discharging before charging. By slowly discharging, the fluctuation of the open circuit voltage due to the battery polarization becomes small. Repeated charging with a small amount of current increases the fluctuation of the open circuit voltage due to battery polarization. Therefore, the control device 10 prohibits estimation of the full charge capacity when charging with a small amount of current is executed a large number of times between the time when the discharging satisfying the predetermined discharge condition is executed and the next charging. By prohibiting the estimation of the full charge capacity when the fluctuation of the open circuit voltage due to the battery polarization is expected to be large, it is possible to avoid estimating the full charge capacity with low accuracy.

Figure 4:
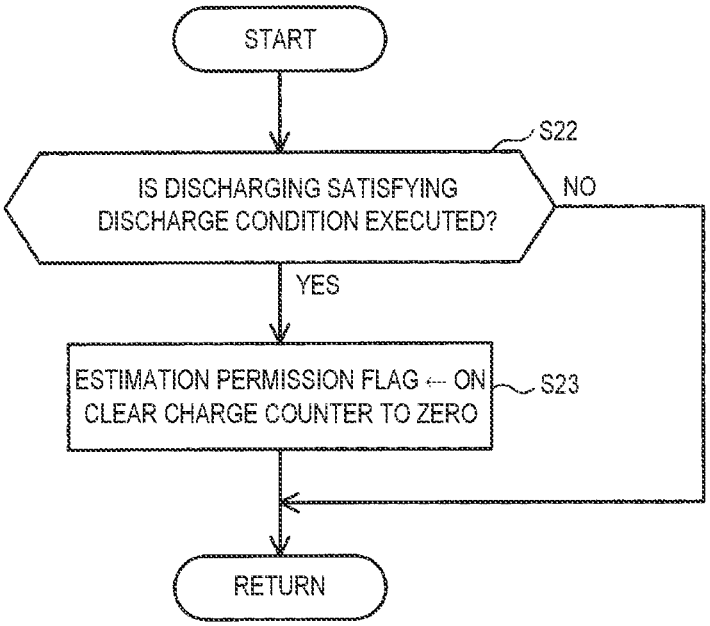
FIG. 4 is a flowchart of a process for operating an estimation permission flag (1)
Figure 5:
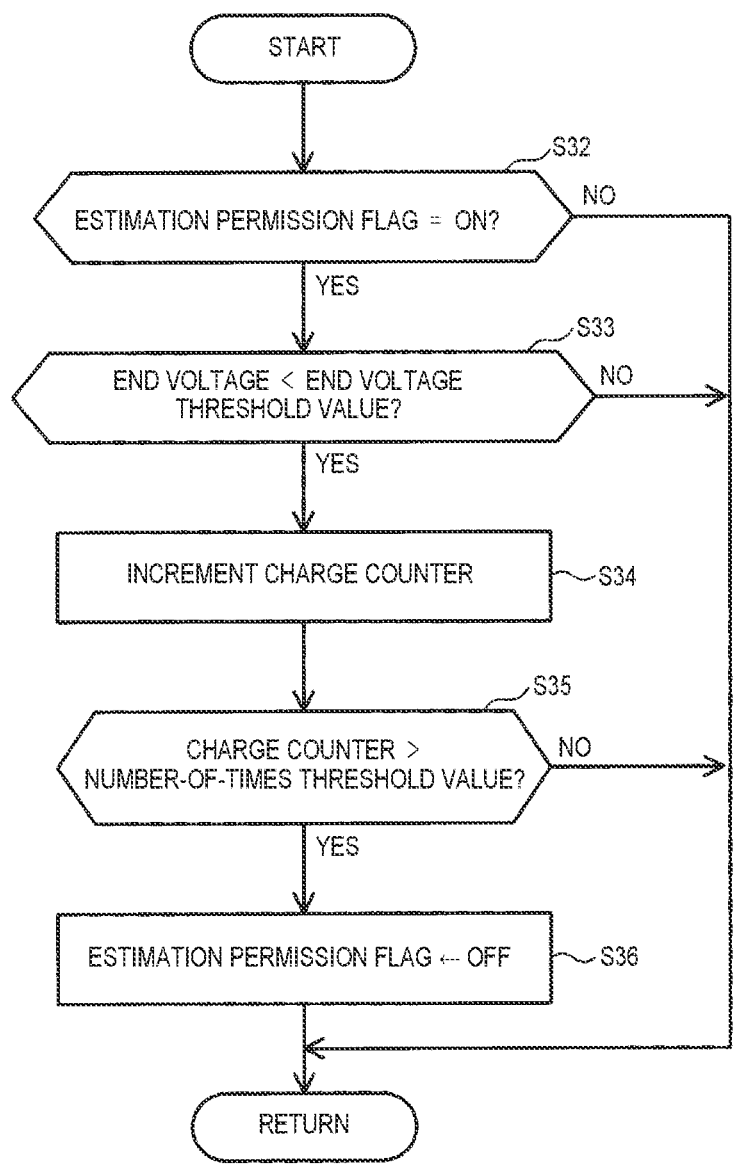
FIG. 5 is a flowchart of a process for operating an estimation permission flag (2)

The process executed by the control device 10 of the second embodiment will be described with reference to FIGS. 4 to 6. In the second embodiment, a flag variable (an estimation permission flag) defined in a program executed by the control device 10 and a counter variable (a charge counter) that measures the elapsed time are used. FIGS. 4 and 5 are flowcharts of the processes of operating the estimation permission flag and the charge counter.

The process of FIG. 4 is repeatedly executed at regular intervals. When the discharging satisfying the discharge condition is executed, the control device 10 sets the estimation permission flag to ON and clears the charge counter to zero (steps S22: YES, S23). The discharge condition is a condition that discharging is executed with a current below a predetermined third current threshold value until the voltage of the main battery 21 falls below the start voltage threshold value. As described above, the voltage fluctuation caused by the battery polarization can be restricted by slowly discharging (by discharging the main battery 21 with a discharge current below the third current threshold value). The third current threshold value may be, for example, 0.1 [c rate].

The control device 10 executes the process of FIG. 5 every time the main battery 21 is charged. As described above, the hybrid vehicle 2 is charged not only by the external electric power source 50 but also with the regenerative power generated by the motors 31, 32. The process of FIG. 5 is executed in both cases of charging by the external electric power source 50 and charging with the regenerative power.

The process of FIG. 5 is executed when the estimation permission flag is set to ON (step S32: YES, S33).

When charging is ended, the control device 10 acquires the voltage (the end voltage) of the main battery 21 at the end of charging and compares the end voltage with the end voltage threshold value (step S33). The end voltage threshold value is the same as the threshold value used in step S8 of FIG. 2. When the end voltage exceeds the end voltage threshold value (step S33: NO), the control device 10 ends the process. When the end voltage is below the end voltage threshold value, the control device 10 increments the charge counter (steps S33: YES, S34). That is, the control device 10 stores the number of times that charging by which the voltage does not reach the end voltage threshold value is executed. Then, when the charge counter exceeds a predetermined number-of-times threshold value, the control device 10 sets the estimation permission flag to OFF (step S35: YES, S36). Even when charging by which the voltage does not reach the end voltage threshold value is executed, when the charge counter is equal to or less than the number-of-times threshold value, the estimation permission flag is not changed (step S35: NO).

The significance of the processes of the flowcharts of FIGS. 4 and 5 are as follows. That is, the control device 10 sets a discharge permission flag to ON when the discharging satisfying the discharge condition is executed. However, after that, when the charging by which the voltage does not reach the end voltage threshold value is executed more than the number-of-times threshold value, the control device 10 sets the discharge permission flag to OFF.

When the system main relay 25 is open and the external electric power source 50 is connected to the electric power inlet 28, the control device 10 starts the process of FIG. 6. The control device 10 executes the processes from steps S2 to S8 in FIG. 2. The description of the processes from steps S2 to S7 will be omitted.

When the start voltage is below the start voltage threshold value and the end voltage is above the end voltage threshold value, the control device 10 refers to the estimation permission flag (steps S8: YES, S41). In step S41, when the estimation permission flag is ON, the permission condition is checked (step S41: YES, S9). When the permission condition is satisfied, the control device 10 performs the full charge capacity estimation process (step S9: YES, S10). On the other hand, when the estimation permission flag is OFF in step S41, the control device 10 does not perform the full charge capacity estimation (step S41: NO). In other words, the control device 10 prohibits the estimation of the full charge capacity when the estimation permission flag is OFF.

As described above, the control device 10 of the second embodiment prohibits the estimation of the full charge capacity when charging with a small amount of current is executed a large number of times between the time when the discharging satisfying the predetermined discharge condition is executed and the next charging. By prohibiting the estimation of the full charge capacity when the fluctuation of the open circuit voltage due to the battery polarization is expected to be large, it is possible to avoid estimating the full charge capacity with low accuracy.

The points to be noted regarding the technique described in the embodiments will be described. The control device 10 estimates the full charge capacity when the battery is charged from the state where the battery voltage is below the start voltage threshold value to the state where the battery voltage exceeds the end voltage threshold value. As described above, a correlation exists between the battery voltage and the charge rate. A correlation also exists between the amount of current by which the battery is charged and the battery voltage. Checking the battery voltage at the end of charging and checking the charge rate at the end of charging, or checking the amount of current supplied to the battery by the end of charging are technically equivalent. The control device 10 may estimate the full charge capacity when the battery is charged until the charge rate exceeds the predetermined end charge rate. Alternatively, the control device may estimate the full charge capacity when the amount of current by which the battery is charged exceeds the predetermined amount of current threshold value.

Although specific examples of the present disclosure are described in detail above, these are merely examples and do not limit the scope of the claims. The techniques described in the claims include various modifications and changes to the specific examples exemplified above. The technical elements described in the present specification or in the drawings exhibit their technical usefulness alone or in various combinations, and are not limited to the combinations described in the claims at the time of filing. In addition, the techniques exemplified in the present specification or the drawings can achieve a plurality of purposes at the same time, and achieving one of the purposes itself has technical usefulness.

What is claimed is:

1. A battery control device configured to estimate a full charge capacity of a battery, the battery control device comprising:

a processor configured to, when the battery is charged from a state where a voltage of the battery is below a predetermined start voltage threshold value to a state where the voltage exceeds a predetermined end voltage threshold value, and the battery satisfies a predetermined permission condition, estimate the full charge capacity based on an amount of current supplied to the battery from a start of charging to an end of charging and voltages of the battery at the start of charging and the end of charging, wherein the processor is configured to:
store a charge counter that is the number of times that charging by which the voltage at the end of charging does not reach the predetermined end voltage threshold value is executed after the battery is discharged under a predetermined discharge condition; and
prohibit estimation of the full charge capacity regardless of whether the predetermined permission condition is satisfied in a case where the charge counter exceeds a predetermined number-of-times threshold value when the voltage exceeds the predetermined end voltage threshold value at the end of charging.

2. The battery control device according to claim 1, wherein the predetermined permission condition includes at least one of following conditions (i) to (v):

(i) temperatures of the battery at the start of charging and the end of charging exceed a predetermined allowable temperature threshold value;

(ii) before the start of charging, current flowing in and out of the battery is below a predetermined first current threshold value for at least a predetermined standby time;

(ii an average current supplied to the battery during charging exceeds a predetermined second current threshold value;

(iv) a charging time from the start of charging to the end of charging is shorter than a predetermined charging time threshold value; and (v) the charging time is shorter than a capacity estimation prohibition time corresponding to an average current obtained by dividing the amount of current by the charging time.

3. The battery control device according to claim 1, wherein the processor is configured to estimate the full charge capacity based on open circuit voltages of the battery at the start of charging and the end of charging.

4. The battery control device according to claim 1, wherein:

the battery control device is mounted on an automobile in which the battery is connected to an inverter configured to drive a traveling motor; and the predetermined permission condition includes a condition that the inverter is cut off from the battery for at least a predetermined standby time before the start of charging.

* * * * *